United States Patent [19]

Ohtoshi et al.

[11] Patent Number: 4,766,091

[45] Date of Patent: Aug. 23, 1988

[54] METHOD FOR PRODUCING AN ELECTRONIC DEVICE HAVING A MULTI-LAYER STRUCTURE

[75] Inventors: Hirokazu Ohtoshi, Kawasaki; Junichi Hanna; Isamu Shimizu, both of Yokohama, all of Japan

[73] Assignee: Canon Kabushiki Kaisha, Tokyo, Japan

[21] Appl. No.: 946,085

[22] Filed: Dec. 24, 1986

[30] Foreign Application Priority Data

Dec. 28, 1985 [JP] Japan .................................. 60-298044

[51] Int. Cl.$^4$ ............................................. H01L 21/20
[52] U.S. Cl. ......................................... 437/108; 437/4;
437/100; 437/101; 437/109; 430/128; 427/53.1;
427/54.1; 427/74; 204/157.4; 204/157.45;
136/258
[58] Field of Search ................ 148/174; 136/258 AM;
427/53.1, 54.1, 74, 86; 204/157.45, 157.4;
437/4, 100, 101, 108, 109; 430/128

[56] References Cited

U.S. PATENT DOCUMENTS

| | | | |
|---|---|---|---|
| Re. 31,708 | 10/1984 | Gordon | 427/126.2 |
| 3,473,978 | 10/1969 | Jackson et al. | 437/93 |
| 3,888,705 | 6/1975 | Fletcher et al. | 437/107 |
| 4,146,657 | 3/1979 | Gordon | 427/126 |
| 4,239,811 | 12/1980 | Kemlage | 437/238 |
| 4,357,179 | 11/1982 | Adams et al. | 437/19 |
| 4,402,762 | 9/1983 | John et al. | 437/16 |
| 4,421,592 | 12/1983 | Shaskus et al. | 156/613 |
| 4,448,801 | 5/1984 | Fukuda et al. | 427/39 |
| 4,459,163 | 7/1984 | MacDiarmid et al. | 148/174 |
| 4,462,847 | 7/1984 | Thompson et al. | 437/99 |
| 4,504,518 | 3/1985 | Ovshinsky et al. | 427/38 |
| 4,522,663 | 6/1985 | Ovshinsky et al. | 148/403 |
| 4,532,199 | 7/1985 | Ueno et al. | 430/128 |
| 4,554,180 | 11/1985 | Hirooka | 427/248.1 |
| 4,615,905 | 10/1986 | Ovshinsky | 427/39 |
| 4,624,736 | 11/1986 | Gee et al. | 156/643 |
| 4,624,906 | 11/1986 | Kawamura et al. | 430/84 |
| 4,637,938 | 1/1987 | Lee et al. | 427/53.1 |
| 4,645,689 | 2/1987 | Cox | 427/255.2 X |
| 4,652,463 | 3/1987 | Peters | 427/53.1 |
| 4,657,777 | 4/1987 | Hirooka | 427/39 |
| 4,689,093 | 8/1987 | Ishihara et al. | 437/5 |
| 4,719,123 | 1/1988 | Haku et al. | 437/101 |

FOREIGN PATENT DOCUMENTS

| | | |
|---|---|---|
| 74212 | 3/1983 | European Pat. Off. . |
| 90586A | 10/1983 | European Pat. Off. . |
| 59-199035 | 12/1984 | Japan . |
| 60-43819 | 3/1985 | Japan .......................... 136/258 AM |
| 2038086A | 7/1980 | United Kingdom . |
| 2148328A | 5/1985 | United Kingdom . |

OTHER PUBLICATIONS

M. Ohnishi et al., *Proceedings 6th E.C. Photovoltaic Solar Energy Conf.* (1985), pp. 677–681.
H. Sakai et al., *Proceedings 6th E.C. Photovoltaic Solar Energy Conf.* (1985), pp. 682–686.
T. Inone et al., *Appl. Phys. Lett.*, vol. 43, pp. 774–776 (1983).
Brodsky et al., *IBM Technical Disclosure Bulletin*, vol. 22, 3391 (Jan. 1980).

*Primary Examiner*—Aaron Weisstuch
*Attorney, Agent, or Firm*—Fitzpatrick, Cella, Harper & Scinto

[57] ABSTRACT

A method for producing an electronic device having a multi-layer structure comprising one or more controlled band gap semiconductor thin layers formed on a substrate comprises forming at least one of said controlled band gap semiconductor thin layers according to the photo CVD method and forming at least one of the other constituent layers according to the method comprising introducing a gaseous starting material for film formation and a gaseous halogenic oxidizing agent having the property of oxidizing said starting material into a reaction space to effect chemical contact therebetween to thereby form a plurality of precursors including a precursor in an excited state and transferring at least one of these precursors into a film forming space communicated with the reaction space as a feed source for the constituent element of the deposited film.

20 Claims, 3 Drawing Sheets

METHOD FOR PRODUCING AN ELECTRONIC DEVICE HAVING A MULTI-LAYER STRUCTURE

BACKGROUND OF THE INVENTION

Field of the Invention

This invention relates to an electronic device having a multi-layer structure such as a thin film semi-conductor device, photovoltaic device, an image forming member for electrophotography, etc., and a method for producing the same.

In the prior art, functional films, i.e., semiconductor thin films for electronic devices such as thin film semiconductor devices, imaging devices, etc., particularly amorphous or polycrystalline semiconductor films, are formed individually by suitable film forming methods from the standpoint of desired physical characteristics, uses, etc.

For example, for formation of an amorphous or polycrystalline, i.e., nonsingle crystalline, silicon film which is optionally compensated for lone pair electrons with a compensating agent such as hydrogen atoms (H) or halogen atoms (X), etc., (hereinafter abbreviated as "NON Si (H,X)", particularly "A-Si (H,X)" when indicating amorphous silicon and "poly-Si (H,X)" when indicating polycrystalline silicon; the so-called microcrystalline silicon is included within the category of A-Si (H,X) as a matter of course), there have been employed the vacuum vapor deposition method, the plasma CVD (PCVD) method, the thermal CVD method, the reactive sputtering method, the ion plating method, the optical CVD method, etc. Generally, the plasma CVD method has been widely used and industrialized.

However, the reaction process during formation of a silicon film according to the plasma CVD method which has been generalized in the prior art is considerably complicated as compared with the CVD method of the prior art, and its reaction mechanism involves not a few unclear points. Also, there are a large number of parameters for formation of a deposited film (for example, substrate temperature, flow rates and flow rate ratio of introduced gases, pressure during formation, high freguency power, electrode structure, structure of reaction vessel, evacuation rate, plasma generating system, etc.). Because of the dependency on such a large number of parameters, the plasma which is formed may sometimes become unstable, which often leads to marked deleterious effects on the deposited film. Besides, such parameters are characteristic of each apparatus and must be selected individually. Therefore under the present situation, it is difficult to standardize the production conditions.

On the other hand, for a silicon film to exhibit sufficiently satisfactory electrical or optical characteristics for particular uses, it is now accepted that the best way to form it is according to the plasma CVD method.

However, depending on the application use cf a silicon film, bulk production with reproducibility may be required with satisfactory results in terms of enlargement of area, uniformity of film thickness as well as uniformity of film quality, and therefore in the formation of silicon films according to the plasma CVD method, an enormous investment in the installation is indispensable for a bulk production apparatus and control means for such bulk production is complicated, with tolerance limits of control being narrow and control of apparatus being severe. These are pointed out as problems to be improved in the future.

Also, in the case of the plasma CVD method, since plasma is directly generated by high frequencies, microwaves, etc., in a film forming space in which a substrate for film formation thereon is placed, electrons or a number of other ionic species generated therein may damage a film being formed in the film forming process thereby lowering the film quality or causing non-uniformity of film quality.

Particularly, in the case of producing an electronic device having a multi-layer structure, interface defects formed between the respective layers may cause worsening of the characteristics of the electronic device obtained. There is shown in FIG. 3 an image forming member for electrophotography as an example, which member comprises a substrate 400 made of aluminum, consisting of a charge injection preventing layer (first layer, amorphous silicon doped with boron B) 401, a photosensitive layer (second layer, amorphous silicon not doped with impurities such as B) 402, and a surface protective layer (third layer, amorphous silicon carbide) 403 respectively deposited on substrate 400. If all the layers are to be formed by the PCVD method, since the kinds of starting material gases, flow rates and plasma discharging intensity for formation of the respective deposited layers differ extremely from one another, effort is required to decrease the influence of the interfaces formed between the respective deposited layers, ordinarily by stopping the discharge between the steps for formation of the first layer and the second layer or for formation of the second layer and the third layer in order to completely exchange the gases, or if continuous production is to be employed, by providing a graded layer by varying gradually the kinds of gases, flow rates and plasma discharge intensity, or by providing separate deposition chambers for formation of the respective deposited layers. In any case, ions generated in the plasma bombard a deposited layer thereby to increase defects. Particularly, in producing an electronic device having a multi-layer constitution, the influence of ion bombardment in the plasma is noticeably severe on the interfaces of respective layers. For this reason, satisfactory improvement therein is required.

As described above, in the formation of silicon films, problems to be solved still remain, and it has been desired to develop a method for forming a deposited film which is capable of bulk production with conservation of energy by the use of an apparatus of low cost, while maintaining the characteristics as well as uniformity of the films at a practically applicable level. Particularly, it has been desired to improve the interface characteristics of an electronic device having a multi-layer structure such as a thin film transistor, photovoltaic device, photosensitive member for electrophotography, etc.

SUMMARY OF THE INVENTION

An object of the present invention is to remove such drawbacks for forming a deposited film as described above and at the same time to provide a novel method for producing an electronic device without the use of the formation method of the prior art and an electronic device obtained thereby.

Another object of the present invention is to provide a method capable of obtaining a deposited film with improved interface characteristics over a large area with easy control of film quality and conservation of energy.

Still another object of the present invention is to provide a method for producing an electronic device having a multi-layer structure which is excellent in bulk productivity, having high quality as well as excellent physical characteristics such as electrical, optical, and semiconductor characteristics.

According to the present invention, there is provided a method for producing an electronic device having a multi-layer structure comprising one or more band gap controlled semiconductor thin layers formed on a substrate, which comprises forming at least one of said band gap controlled semiconductor thin layers according to the photo CVD method and forming at least one of the other constituent layers according to the method comprising introducing a gaseous starting material for film formation and a gaseous halogenic oxidizing agent having the property of oxidizing said starting material into a reaction space to effect chemical contact therebetween to thereby form a plurality of precursors including a precursor in a excited state and transferring at least one of these precursors into a film forming space communicated with the reaction space as a feed source for the constituent element of the deposited film (hereinafter abbreviated as FOCVD), and an electronic device obtained thereby.

According to the method for producing an electronic device of the present invention, a film having a multilayer constitution improved in interface characteristics is obtained and simplification of control and bulk production can be effected with satisfactory enlargement of area, uniformity of film thickness and film quality simultaneously with conservation of energy, without requiring an enormous investment for installation of bulk production apparatus, and also the control parameters for bulk production are clarified to afford broad tolerance limits and simple control of apparatus.

DESCRIPTION OF THE PREFERRED EMBODIMENT

Figure 1:
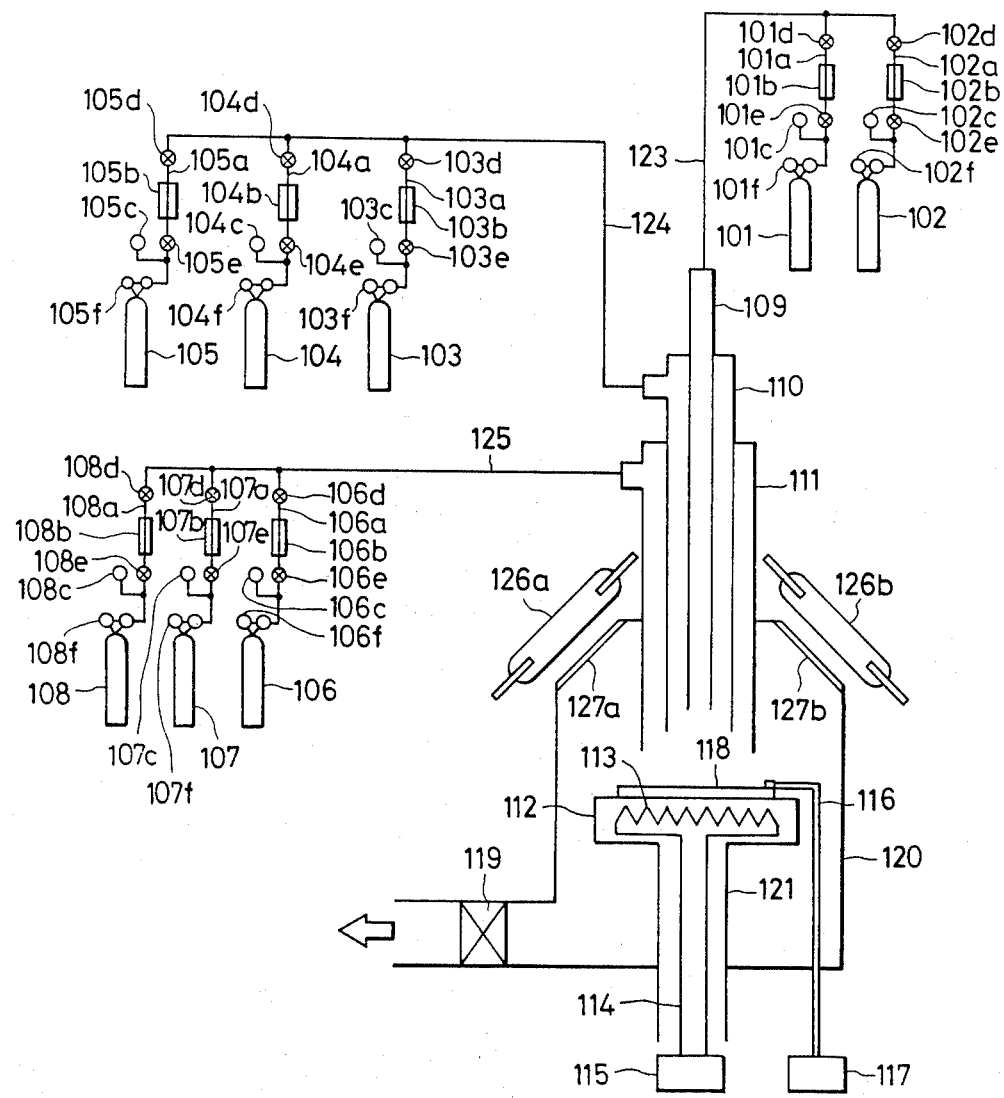
FIG. 1 is a schematic illustration of an apparatus for practicing the method of the present invention.

In the method for producing an electronic device of the present invention, the gaseous starting material to be used for formation of a deposited film (semiconductor thin film by the FOCVD method) is oxidized through chemical contact with a gaseous halogenic oxidizing agent and can be selected suitably as desired depending on the kind, characteristic, use, etc., of the deposited film to be obtained. In the present invention, the above gaseous starting material and the gaseous halogenic oxidizing agent need only to be gaseous during chemical contact when introduced into a reaction space, and they can be either liquid or solid in their ordinary state.

When the starting material for formation of a deposited film or the halogenic oxidizing agent is liquid or solid, it is introduced into the reaction space in a gaseous state through bubbling with a carrier gas such as Ar, He, $N_2$, $H_2$, etc., optionally with application of heat.

During this operation, the partial pressures and mixing ratio of the above gaseous starting material and the gaseous halogenic oxidizing agent may be set by controlling the flow rate of the carrier gas and the vapor pressures of the starting material for the deposited film and the gaseous halogenic oxidizing agent.

As the starting material for the deposited film to be used in the FOCVD method of the present invention, for example, if a tetrahedral type deposited film such as semiconductive or electrically insulating silicon or germanium, etc., is desired to be obtained, straight or branched chain silane compounds, cyclic silane compounds, chain type germanium compounds, etc., may be employed. Specifically, examples of straight chain silane compounds may include $Si_nH_{2n+2}$ (n=1, 2, 3, 4, 5, 6, 7, 8), examples of branched chain silane compounds include $SiH_3SiH(SiH_3)$ $SiH_2SiH_3$ and examples of cyclic silane compounds include $Si_nH_{2n}$ (n=3, 4, 5, 6).

Of course, these starting materials may be used either singly or as a mixture of two or more kinds, and may also be used as the starting material gas for forming films according to the optical CVD method.

The halogenic oxidizing agent to be used in the present invention must be gaseous when introduced into the reaction space and at the same time must have the property of effectively oxidizing the gaseous starting material for film formation which is introduced into the reaction space by mere chemical contact therewith, and includes halogen gases such as $F_2$, $Cl_2$, $Br_2$, $I_2$, etc., and nascent fluorine, chlorine, bromide, etc.

The halogenic oxidizing agent is introduced into the reaction space in a gaseous state together with the starting material gas for film formation as described above at a desired flow rate and feed pressure, wherein it is mixed and reacted with the above starting material, thereby oxidizing the above starting material to efficiently generate a plurality of precursors including a precursor in a chemically excited state. Of the precursors in an excited state and other precursors which are generated, at least one of them functions as a feed source for the constituent element of the deposited film.

The precursors which are generated may undergo decomposition or reaction to be converted into other precursors in an excited state or to precursors in another excited state, or alternatively may be left in their original forms although, if desired, they may release energy on contact with the substrate surface arranged in the film forming space, whereby a deposited film with a three-dimensional network structure is prepared when the substrate surface temperature is relatively low or a crystalline deposited film is formed when the substrate surface temperature is higher.

In the present invention, so that the film forming process may proceed smoothly to form a film of high quality and having desired physical characteristics, the film forming factors, i.e., the kinds and combinations of the starting material and the halogenic oxidizing agent, their mixing ratio, pressure during mixing, flow rate, pressure in the film forming space, gas flow velocity and film forming temperature (substrate temperature and atmosphere temperature) are suitably selected as desired. These film forming factors are organically related to each other, and they are not determined individually but determined respectively under mutual relationships. In the present invention, the ratio of the gaseous starting material for film formation and the gaseous halogenic oxidizing agent introduced into the reaction space may be determined suitably in relation to the film forming factors as mentioned above, but it is preferably 1/20 to 100/1, more preferably 1/5 to 50/1 in terms of flow rate ratio of introduced gases.

The pressure during mixing when the gases are introduced into the reaction space may be preferably higher in order to enhance the probability of chemical contact between the above gaseous starting material and the above gaseous halogenic oxidizing agent, but it is better to determine the optimum value as desired in view of reactivity. Although the pressure during mixing may be determined as described above, each pressure during introduction may be preferably $1 \times 10^{-7}$ atm to 5 atm, more preferably $1 \times 10^{-6}$ atm to 2 atm.

The pressure within the film forming space, namely the pressure of the space in which a substrate for film formation thereon is placed, may be set suitably as desired so that precursors (E) in an excited state generated in the reaction space and sometimes precursors (D) formed as secondary products from said precursors (E) may contribute effectively to film formation.

The pressure inside the film forming space, when the film forming space is communicated openly to the reaction space, can be controlled in relation to the introduction pressures and flow rates of the gaseous starting material for film formation and the gaseous halogenic oxidizing agent into the reaction space, for example, by use of e.g. a differential evacuation or large scale evacuating device.

Alternatively, when the conductance at the communicating portion between the reaction space and the film forming space is small, the pressure in the film forming space can be controlled by providing an appropriate evacuating device to the film forming space and controlling the evacuation rate of said device.

On the other hand, when the reaction space and the film forming space are integral and the reaction position and the film forming position are only spatially different, it is possible to effect differential evacuation or provide a large scale evacuating device having sufficient evacuating capacity as described above.

As described above, the pressure in the film forming space may be determined according to the relationship between the introduction pressures of the gaseous starting material and the gaseous halogenic oxidizing agent introduced into the reaction space, but it is preferably 0.001 Torr to 100 Torr, more preferably 0.01 Torr to 30 Torr, optimally 0.05 to 10 Torr.

The gas flow velocity is selected in view of the geometric arrangement of the gas introducing port, the substrate, and the gas discharging port such that the starting material for film formation and the halogenic oxidizing agent may be efficiently mixed during introduction of these into the reaction space, whereby the above precursors (E) may be efficiently generated and film formation may be adequately performed without trouble. A preferable example of the geometric arrangement is shown in FIG. 1.

The substrate temperature (Ts) during film formation is set as desired depending on the gas species employed and the kinds and required characteristics of the deposited film to be formed, but, in the case of obtaining an amorphous film, it is preferably from room temperature to 450° C., more preferably from 50° to 400° C. Particularly, in the case of forming a silicon film with better semiconductor and photoconductive characteristics, etc., the substrate temperature (Ts) should desirably be made 70° to 350° C. On the other hand, in the case of obtaining a polycrystalline film, it should preferably be 200° to 700° C., more preferably, 300° to 600° C.

The atmospheric temperature (Tat) in the film forming space is determined in relation to the substrate temperature such that the precursors (E) and (D) are not changed to unsuitable chemical species for film formation, and also the precursors (E) may be efficiently generated.

FIG. 1 shows an example of preferable apparatus for practicing the method of the present invention.

The apparatus shown in FIG. 1 is broadly divided into a main body (vacuum chamber), an evacuation system, and a gas feeding system.

In the main body, a reaction space and a film forming space are provided.

101–108 are respective tanks filled with the gases to be used during film formation, 101a–108a are respective gas feeding pipes, 101b–108b are respective mass flow controllers for controlling the flow rates of the gases from the respective tanks, 101c–108c are respective gas pressure gauges, 101d–108d and 101e–108e are respective valves, an 101f–108f are respective pressure gauges indicating the pressures in the corresponding gas tanks.

120 is a vacuum chamber equipped at the upper portion with a means for gas introduction, a reaction space downstream of the gas introduction means, and also having a film forming space in which a substrate holder 112 is provided so that a substrate 118 may be placed opposed to the gas introducing port of said gas introduction means. The means for gas introduction has a triple concentric tubular structure, having from the innerside a first gas introducing pipe 109 for introducing gases from the gas tanks 101, 102, a second gas introducing pipe 110 for introducing gases from the gas tanks 103–105, and a third gas introducing pipe 111 for introducing gases from the gas tanks 106–108.

For gas introduction to the reaction space from each gas introducing pipe, each position is designed so as to be arranged farther from the substrate surface as the pipe is nearer to the inner side. In other words, the gas introducing pipes are arranged so that the pipe on the outer side may enclose the pipe located within the innerside thereof.

The gases from the respective tanks are fed into the respective introducing pipes through the gas feeding pipelines 123–125, respectively.

The respective gas introducing pipes, the respective gas feeding pipelines and the vacuum chamber 120 are evacuated through a main vacuum valve 119 by means of an evacuating device not shown.

The substrate 118 is set at a suitable desired distance from the positions of the respective gas introducing pipes by vertically moving the substrate holder 112.

In the case of the present invention, the distance between the substrate and the gas introducing port of the gas introducing means may be determined appropriately in view of the kinds and desired characteristics of the deposited film to be formed, the gas flow rates, the pressure inside the vacuum chamber, etc., but it is preferably several mm to 20 cm, more preferably 5 mm to about 15 cm.

113 is a heater provided in order to heat the substrate to an appropriate temperature during film formation, or preheating the substrate 118 before film formation, or further to anneal the film after film formation.

The substrate heater 113 is supplied with power through a conductive wire 114 from a power source 115.

116 is a thermocouple for measuring the temperature of the substrate (Ts) and is electrically connected to the temperature display device 117.

126a and 126b are photon energy generating devices for supplying photon energy into the vacuum chamber 120. 127a and 127b are windows for irradiating light energy into the vacuum chamber 120.

The gaseous material for supplying compounds containing elements for expanding the band gap as a band gap controller to be used in the present invention may include carbon containing compounds, oxygen compounds, nitrogen compounds, etc.

Specifically, examples of carbon containing compounds include compounds represented by the formula $C_nH_{2n+2}$ (n is a natural number) such as $CH_4$, $C_2H_6$, $C_3H_8$, $C_4H_{10}$, etc., compounds represented by $C_nH_{2n}$ (n is a natural number) such as $C_2H_4$, $C_3H_6$, $C_4H_8$, etc., compounds such as $C_2H_2$, $C_6H_6$, etc. Examples of oxygen containing compounds may include compounds such as $O_2$, $CO_2$, $NO$, $NO_2$, $N_2O$, $O_3$, $CO$, $H_2O$, $CH_3OH$, $CH_3CH_2OH$, etc.

Examples of nitrogen containing compounds include $N_2$, $NH_3$, $N_2H_5N_3$, $N_2H_4$, $NH_4N_3$, etc.

On the other hand, the gaseous material for supplying compounds containing elements for reducing the band gap as a band gap controller may include chain type germanium compounds, tin compounds, etc. as effective ones.

Specifically, examples of chain type germanium compounds include $Ge_mH_{2m+2}$ (m=1, 2, 3, 4, 5), etc. and examples of tin compounds include hydrogenated tin such as $SnH_4$, etc.

In the present invention, the method for forming a controlled band gap film is essentially different from that for formation of an uncontrolled band gap film, but the film forming means for both methods can be arranged in the same apparatus. In this case, when either one of the film forming means is operating, the other film forming means is required to be stopped. Also, it is possible to connect both of the film forming means to each other through a gate valve, etc. and carry out formation of both films continuously.

The valence electron controller to be used in the case of forming a valence electron controlled film as one of the layers constituting a multi-layer structure may include, in the case of silicon type semiconductor films and germanium type semiconductor films, a p-type valence electron controller, namely compounds containing elements of group III of the Periodic Table functioning as a so-called p-type impurity such as B, Al, Ga, In, Tl, etc., and an n-type valence electron controller, namely compounds containing elements of group V of the Periodic Table functioning as the so-called n-type impurity such as N, P, As, Sb, Bi, etc.

Specifically, the material for supplying the valence electron controller may include $NH_3$, $HN_3$, $N_2H_5N_3$, $N_2H_4$, $NH_4N_3$, $PH_3$, $P_2H_4$, $AsH_3$, $SbH_3$, $BiH_3$, $B_2H_6$, $B_4H_{10}$, $B_5H_9$, $B_5H_{11}$, $B_6H_{10}$, $B_6H_{12}$, $Al(CH_3)_3$, $Al(C_2H_5)_3$, $Ga(CH_3)_3$, $In(CH_3)_3$, etc.

These valence electron controllers can be used also as the band gap controller by adding them in large amounts. The substrate to be used in the present invention may be either electroconductive or electrically insulating, provided that it is selected as desired depending on the use of the deposited film formed. As an electroconductive substrate, there may be mentioned metals such as NiCr, stainless steel, Al, Cr, Mo, Au, Ir, Nb, Ta, V, Ti, Pt, Pd, etc., or alloys thereof.

As an insulating substrate, there may be conventionally be used films or sheets of synthetic resins, including polyesters, polyethylene, polycarbonate, cellulose acetate, polypropylene, polyvinyl chloride, polyvinylidene chloride, polystyrene, polyamides, etc., glass, ceramics and so on. At least one side surface of these substrates is preferably subjected to a treatment for imparting electroconductivity, and it is desirable to provide other layers on the side at which said electroconductive treatment has been applied.

For example, electroconductive treatment of a glass substrate can be effected by providing a thin film of NiCr, Al, Cr, Mo, Au, Ir, Nb, Ta, V, Ti, Pt, Pd, $In_2O_3$, $SnO_2$, ITO ($In_2O_3+SnO_2$) thereon.

Alternatively, a synthetic resin film such as polyester film can be subjected to the electroconductive treatment on its surface by vacuum vapor deposition, electron beam deposition or sputtering of a metal such as NiCr, Al, Ag, Pb, Zn, Ni, Au, Cr, Mo, Ir, Nb, Ta, V, Ti, Pt, etc., or by a laminating treatment with such metals, thereby imparting electroconductivity to the surface. The substrate may be shaped in any form such as cylinders, belts, plates or others, and its form may be determined as desired.

The substrate should preferably be selected from among those set forth above in view of adhesion and reactivity between the substrate and the film. Further, if the difference in thermal expansion between both is great, a large amount of strain may be created within the film which sometimes gives films of poor guality, and therefore it is preferable to use a substrate wherein the difference in thermal expansion is small.

Also, the surface state of the substrate is directly related to the structure of the film (orientation) or generation of or a stylet structures, and therefore it is desirable to treat the surface of the substrate to give a film structure and a film texture so that desired characteristics may be obtained.

The layer to be formed by the optical CVD method is preferably formed by the use of an apparatus adapted for utilization of both the FOCVD method and the optical CVD method as shown in FIG. 1. However, it may be formed by the use of a conventional optical CVD apparatus.

Figure 5:
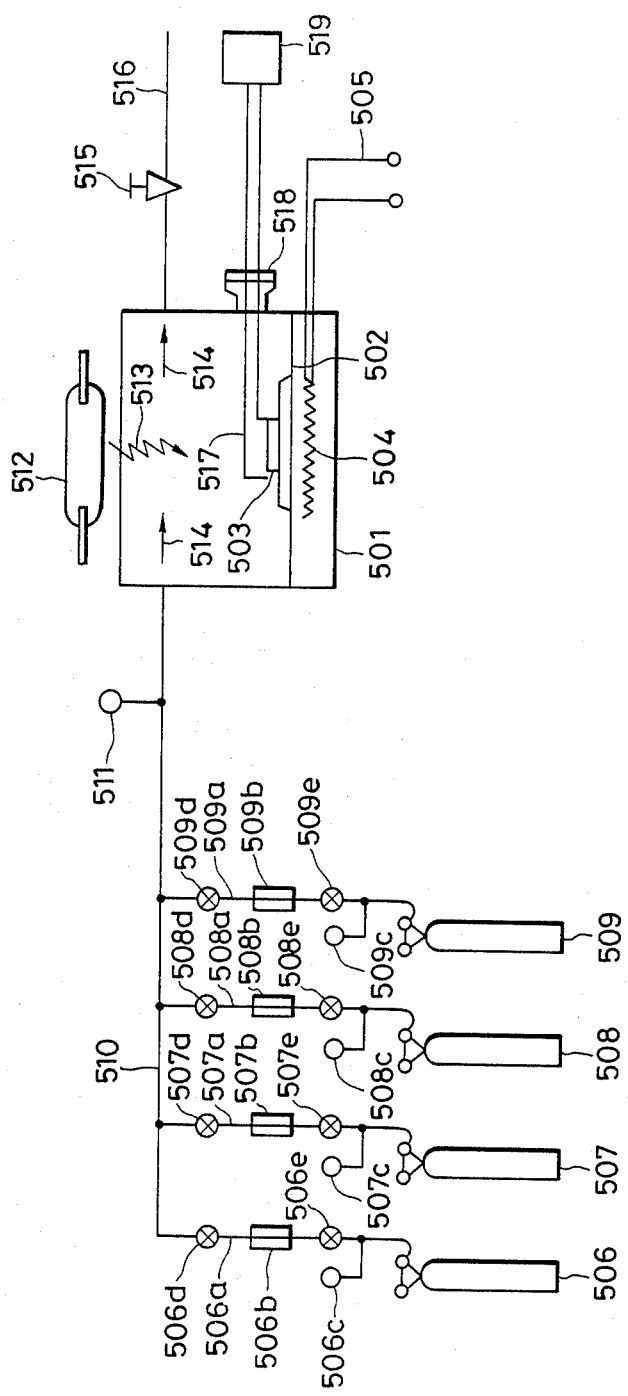
FIG. 5 is a schematic illustration of an apparatus for forming a film by the photo CVD method.

FIG. 5 illustrates schematically the device for forming a deposited film according to the photo CVD method, wherein 501 is a deposition chamber for forming a deposited film, and 502 is a supporting stand for supporting a substrate 503 placed internally of the deposition chamber.

504 is a heater for heating the substrate and is supplied with power through conductive wires 505 to generate heat.

506 through 509 are gas feeding sources and they are provided corresponding to the kinds of gases used, including silicon containing compounds, hydrogen, halogen compounds, inert gases and compounds containing as a component an impurity element for band gap control. Of these starting material compounds, when those which are liquid under standard state are used, a suitable gasifying device is provided. In the drawing, the numerals of gas feeding sources 506 through 509 affixed with the symbol a are branch pipes, those affixed with b flowmeters, those affixed with c pressure gauges for measuring the pressures on the higher pressure side of the respective flowmeters, those affixed with d or e valves for controlling the respective gas flow rates. The gases of the starting material compounds are introduced through the introducing pipe 510 into the film forming chamber 501.

512 is a photon energy generating device, and the light energy from the light energy generating device 511 acts on the starting material gas flowing in the direction of the arrowhead 514 to excite and decompose the starting material gas to form a band gap controlled film on the substrate 503 through chemical reaction of the decomposed compounds. 515 is an evacuation valve, and 516 is an evacuation pipe, which is connected to an evacuation device (not shown) for vacuum evacuation of the film forming space.

The high energy light to be used in the method of the present invention may be generated from, for example, a low pressure mercury lamp, xenon lamp, carbon dioxide laser, argon ion laser, excimer laser, etc. The light or photon energy to be used in the present invention is not limited to UV-ray energy, i.e. its wavelength is not limited, provided that it can excite, decompose and polymerize the starting material gas to deposit decomposed products. Also, the case when light energy is absorbed by the starting material gas or the substrate and converted to heat energy and excitation or decomposition or polymerization of the starting material gas is brought about by the heat energy to form a deposited film is not excluded from the invention.

When, for example, a film of controlled band gap is to be formed by use of such an apparatus, a suitable substrate is placed on the supporting stand and the film forming chamber is internally evacuated to a reduced pressure through the evacuation pipe by use of an evacuation device (not shown).

Next, with heating of the substrate, if desired, starting material gases such as $SiH_4$, $H_2$, etc. and the starting material gases for the band gap controller such as $O_2$, $GeH_4$, $CH_4$, etc. are introduced from the gas feeding tanks through the gas introducing pipe 510 into the film forming chamber 501, and plasma is generated in the film forming chamber by the plasma generating device with the pressure in the film forming space being maintained at a predetermined value to form a controlled band gap film on the substrate 503.

Now, the production of a solar battery, a photosensitive device for electrophotography, and a thin film transistor (hereinafter called TFT) according to the present invention is described in detail below.

EXAMPLE 1

Figure 2:
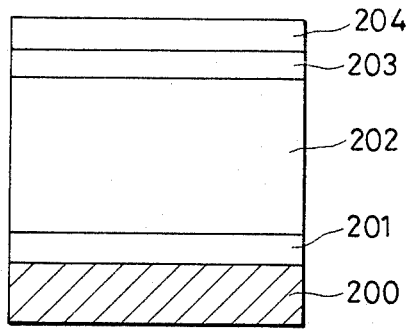
FIG. 2 is a schematic illustration of the layer constitution of a solar cell produced by the method of the present invention.

FIG. 2 illustrates schematically an example of the solar battery produced according to the present invention.

In this figure, on a glass substrate 200 are formed as a laminate a transparent electrode (not shown), p-type amorphous silicon carbide layer 201 (first layer, thickness 300 Å), i-type amorphous silicon layer 202 (second layer, thickness 1 μm), n-type amorphous silicon layer 203 (third layer, thickness 200 Å), and an Al electrode 204.

In depositing the p-type amorphous silicon carbide layer 201, $SiH_4$ gas in the tank 101 was introduced at a flow rate of 20 sccm through the gas introducing pipe 109, $B_2H_6He$ gas ($B_2H_6$ concentration 10000 ppm) in the tank 103 at a flow rate of 3 sccm and $CH_4$ gas in the tank 105 at a flow rate of 100 sccm through the gas introducing pipe 110 and He gas in the tank 107 at a flow rate of 20 sccm through the gas introducing pipe 111 were respectively introduced into the vacuum chamber 120. From the low pressure mercury lamps 126a and 126b, light of 15 mW/cm$^2$ was irradiated. Thus, a p-type amorphous silicon carbide layer 201 expanded in band gap by carbon was formed. For this reason, the window effect was enhanced to improve photoelectric converting efficiency.

The i-type amorphous silicon layer 202 and the n-type amorphous silicon layer 203 were deposited by mixing and reacting a gaseous starting material for film formation and a gaseous halogenic oxidizing agent having the property of oxidizing said starting material in the vacuum chamber 120 (by FOCVD).

That is, in the case of the i-type amorphous silicon 202, $SiH_4$ gas in the tank 101 was introduced at a flow rate of 30 sccm through the gas introducing pipe 109, $F_2$ gas in the tank 106 at a flow rate of 20 sccm and He gas in the tank 107 at a flow rate of 100 sccm were respectively introduced through the gas introducing pipe 111 into the vacuum chamber 120.

During this operation, the pressure in the vacuum chamber 120 was maintained at 0.7 Torr by controlling the opening of the vacuum valve 119. The distance between the gas introducing pipe 111 and the substrate was set at 3 cm. In the mixing region of $SiH_4$ gas and $F_2$ gas, blueish white luminescence was strongly observed.

In the case of the n-type amorphous silicon layer 203, $SiH_4$ gas in the tank 101 was introduced at a flow rate of 20 sccm through the gas introducing pipe 109, $PH_3$/He gas in the tank 104 ($PH_3$ concentration 1000 ppm) at a flow rate of 3 sccm through the gas introducing pipe 110, $F_2$ gas in the tank 106 at a flow rate of 15 sccm and He gas in the tank 107 at a flow rate of 80 sccm through the gas introducing pipe 111 were respectively introduced into the vacuum chamber 120. The pressure in the vacuum chamber 120 was adjusted to 0.4 Torr by controlling the opening of the vacuum valve 119.

In formation of the respective layers, the substrate temperature was set at 250° C.

The solar battery thus obtained exhibited photoelectric converting efficiency higher by 20% than the prior art product.

EXAMPLE 2

Figure 3:
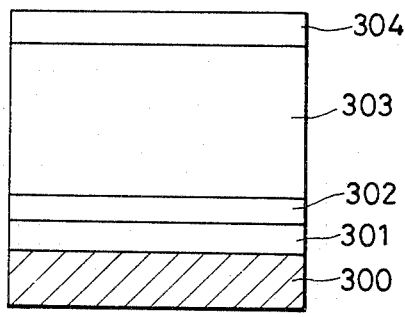
FIG. 3 is a schematic illustration of the layer constitution of an image forming member for electrophotography produced by the method of the present invention.

FIG. 3 illustrates schematically an example of an image forming member for electrophotography produced according to the present invention.

In this figure, on an Al substrate 300, a light reflection preventing layer 301 (first layer, amorphous silicon germanium controlled in band gap by Ge, thickness 0.5 μm), a charge injection preventing layer 302 (second layer, amorphous silicon doped with B, thickness 0.5 μm), a photosensitive layer 303 (third layer, amorphous silicon layer, thickness 18 μm), a surface protective layer and light absorption increasing layer 304 (fourth layer, amorphous silicon carbide controlled in band gap by C, thickness 0.1 μm) were formed as a laminate.

The image forming member as described above was produced by use of the apparatus shown in FIG. 1 under the film forming conditions shown in Table 1.

The image forming member for electrophotography obtained by this Example was found to exhibit charging characteristics improved by 22% or more, reduced image defect number by about 10% and also improved sensitivity by 18% or more as compared with the prior art product.

TABLE 1

| Layer Structure | Starting material | Flow rate (SCCM) | Deposition method | Pressure (Torr) |
|---|---|---|---|---|
| First layer a-SiGe | SiH$_4$ | 30 | Optical CVD | 0.3 |
| | B$_2$H$_6$/He (1000 ppm) | 3.5 | | |
| | GeH$_4$ | 5 | | |
| | He | 20 | | |
| Second layer p-type | SiH$_4$ | 20 | Optical CVD | 0.3 |
| | B$_2$H$_6$/He (1000 ppm) | 4 | | |
| | N$_2$O | 8 | | |
| | He | 25 | | |
| Third layer i-type | SiH$_4$ | 80 | FOCVD | 0.8 |
| | F$_2$ | 60 | | |
| | He | 200 | | |
| Fourth layer a-SiC | SiH$_4$ | 10 | FOCVD | 0.5 |
| | C$_2$H$_4$ | 50 | | |
| | F$_2$ | 50 | | |
| | He | 50 | | |

EXAMPLE 3

Figure 4:
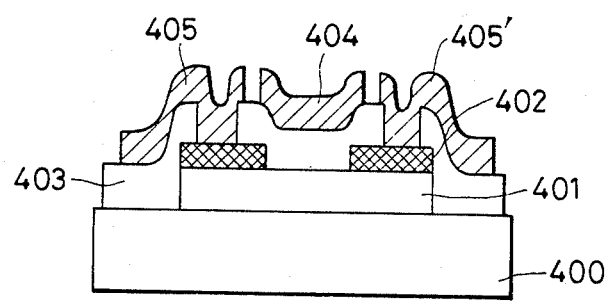
FIG. 4 is a schematic illustration of the layer constitution of a thin film transistor produced by the method of the present invention.

FIG. 4 illustrates schematically an example of a TFT of the present invention.

In this figure, on a glass substrate 400, an amorphous silicon layer 401 (first layer, thickness 7000 Å), an amorphous silicon layer 402 doped with phosphorus to a high concentration (second layer, thickness 500 Å), an insulating layer 403 (third layer, thickness 1000 Å), a gate electrode 404, and source and drain electrodes 405, 405' of Al were formed.

The TFT as described above was prepared by use of the apparatus shown in FIG. 1 under the film conditions shown in Table 2.

The TFT prepared by this Example was improved in ON/OFF resistance ratio by about 15% as compared with the prior art product.

TABLE 2

| Layer Structure | Starting material | Flow rate (SCCM) | Deposition method | Pressure (Torr) |
|---|---|---|---|---|
| First layer | SiH$_4$ | 20 | FOCVD | 0.7 |
| | F$_2$ | 15 | | |
| | He | 150 | | |
| Second layer | SiH$_4$ | 15 | FOCVD | 0.6 |
| | PH$_3$/He | 3 | | |
| | F$_2$ | 15 | | |
| | He | 20 | | |
| Third layer | SiH$_4$ | 20 | Optical CVD | 0.3 |
| | C$_2$H$_4$ | 100 | | |
| | He | 300 | | |

As described in detail above, since the respective layers are improved in interface characteristics, semiconductor devices with excellent characteristics can be obtained as shown by the above examples.

Also, the present invention can effect conservation of energy and at the same time provide an electronic device having a deposited film having uniform physical characteristics over a large area with easy management of the film quality. Further, it can give easily an electronic device having a multi-layer structure having excellent physical characteristics such an electrical, optical, semiconductor characteristics, etc., and good bulk productivity.

We claim:

1. A method for producing an electronic device having a multi-layer structure comprising one or more controlled band gap semiconductor thin layers formed on a substrate, which comprises forming at least one of said controlled band gap semiconductor thin layers according to the photo CVD method and forming at least one of the other constituent layers according to the method comprising introducing a gaseous starting material for film formation and a gaseous halogenic oxidizing agent having the property of oxidizing said starting material into a reaction space to effect chemical contact therebetween to thereby form a plurality of precursors including a precursor in an excited state and transferring at least one of these precursors into a film forming space communicated with the reaction space as a feed source for the constituent element of the deposited film.

2. A method for producing an electronic device according to claim 1, wherein said controlled band gap semiconductor thin layer is a tetrahedral type film.

3. A method for producing an electronic device according to claim 1, wherein said gaseous starting material is a chain type silane compound.

4. A method for producing an electronic device according to claim 3, wherein said chain type silane compound is a straight chain silane compound.

5. A method for producing an electronic device according to claim 4, wherein said straight chain silane compound is represented by the formula Si$_n$H$_{2n+2}$ where n is an integer of 1 to 8.

6. A method for producing an electronic device according to claim 3, wherein said chain type silane compound is a branched chain silane compound.

7. A method for producing an electronic device according to claim 1, wherein said gaseous starting material is a silane compound having a cyclic structure of silicon.

8. A method for producing an electronic device according to claim 1, wherein said gaseous starting material is a chain type germane compound.

9. A method for producing an electronic device according to claim 8, wherein said chain type germanium compound is represented by the formula Ge$_m$H$_{2m+2}$ where m is an integer of 1 to 5.

10. A method for producing an electronic device according to claim 1, wherein said gaseous starting material is a tetrahedral type compound.

11. A method for producing an electrode device according to claim 1, wherein said gaseous halogenic oxidizing agent contains a halogen gas.

12. A method for producing an electronic device according to claim 1, wherein said gaseous halogenic oxidizing agent contains fluorine gas.

13. A method for producing an electronic device according to claim 1, wherein said gaseous halogenic oxidizing agent contains chlorine gas.

14. A method for producing an electronic device according to claim 1, wherein said gaseous halogenic oxidizing agent is a gas containing fluorine atoms as a constituent.

15. A method for producing an electronic device according to claim 1, wherein said gaseous halogenic oxidizing agent contains a nascent halogen.

16. A method for producing an electronic device according to claim 1, wherein said substrate is arranged at a position opposed to the direction in which said gaseous starting material and said gaseous halogenic oxidizing agent are introduced into said reaction space.

17. A method for producing an electronic device according to claim 1, wherein a gaseous material for supplying a band gap controller is introduced into said reaction space.

18. A method for producing an electronic device according to claim 17, wherein said gaseous material is selected from carbon containing compounds, oxygen containing compounds, and nitrogen containing compounds.

19. A method for producing an electronic device according to claim 18, wherein said selected gaseous material is one selected from the group consisting of $CH_4$, $C_2H_6$, $C_3H_8$, $C_4H_{10}$, $C_2H_4$, $C_3H_6$, $C_4H_8$, $C_2H_2$, $C_6H_6$, $O_2$, $CO_2$, $NO$, $NO_2$, $N_2O$, $O_3$, $CO$, $H_2O$, $CH_3OH$, $CH_3CH_2OH$, $N_2$, $NH_3$, $N_2H_5N_3$, $N_2H_4$, and $NH_4N_3$.

20. A method for producing an electronic device according to claim 1, wherein a gaseous material for supplying a valence electron controller is introduced into said reaction space.

* * * * *

UNITED STATES PATENT AND TRADEMARK OFFICE
CERTIFICATE OF CORRECTION

PATENT NO. : 4,766,091
DATED : August 23, 1988
INVENTOR(S) : HIROKAZU OHTOSHI, ET AL.

Page 1 of 2

It is certified that error appears in the above-identified patent and that said Letters Patent is hereby corrected as shown below:

AT [56] IN REFERENCES CITED

Other Publications, "T. Inone et al.," should read --T. Inoue et al.,--.

COLUMN 1

Line 25, ""NON Si(H,X)"," should read --"NON-Si(H,X)",--.

COLUMN 7

Line 28, "$NH_3,N_2H_5N_3,$" should read --$NH_3$, $N_2H_5N_3$,--.

COLUMN 8

Line 35, "guality," should read --quality,--.

UNITED STATES PATENT AND TRADEMARK OFFICE
CERTIFICATE OF CORRECTION

PATENT NO. : 4,766,091
DATED : August 23, 1988
INVENTOR(S) : HIROKAZU OHTOSHI, ET AL.    Page 2 of 2

It is certified that error appears in the above-identified patent and that said Letters Patent is hereby corrected as shown below:

COLUMN 9

Line 67, "$B_2H_6He$ gas" should read --$B_2H_6$/He gas--.

Signed and Sealed this

Twenty-fifth Day of April, 1989

Attest:

DONALD J. QUIGG

*Attesting Officer*   *Commissioner of Patents and Trademarks*